(12) United States Patent
Saito

(10) Patent No.: US 6,344,896 B1
(45) Date of Patent: Feb. 5, 2002

(54) METHOD AND APPARATUS FOR MEASURING POSITIONAL SHIFT/DISTORTION BY ABERRATION

(75) Inventor: Hirofumi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,803

(22) Filed: Apr. 26, 2000

(30) Foreign Application Priority Data

Apr. 30, 1999 (JP) .......................................... 11-123688

(51) Int. Cl.⁷ ................................................ G01B 9/00
(52) U.S. Cl. ............................ 356/124; 355/53; 355/77
(58) Field of Search ................................. 356/124, 125, 356/127, 399–401; 355/53, 55, 77; 250/548; 430/30, 22

(56) References Cited

U.S. PATENT DOCUMENTS

| | | | | |
|---|---|---|---|---|
| 5,418,613 A | * | 5/1995 | Matsutani | 356/401 |
| 5,615,006 A | * | 3/1997 | Hirukawa et al. | 356/124 |
| 5,760,879 A | * | 6/1998 | Shinonaga et al. | 355/55 |
| 5,789,734 A | | 8/1998 | Torigoe et al. | |
| 5,814,425 A | * | 9/1998 | Kataoka et al. | 430/30 |
| 5,945,239 A | * | 8/1999 | Taniguchi | 430/30 |
| 6,163,376 A | * | 12/2000 | Nomura et al. | 356/401 |

FOREIGN PATENT DOCUMENTS

| | | |
|---|---|---|
| EP | 0849638 A3 | 6/1998 |
| EP | 0849638 A2 | 6/1998 |
| JP | 6-117831 | 4/1994 |
| JP | 8-078309 | 3/1996 |

* cited by examiner

*Primary Examiner*—Hoa Q. Pham

(57) ABSTRACT

In a distortion measuring method, a mask having at least a first diffraction grating pattern having an array of a plurality of large patterns and a second diffraction grating pattern having arrays of a plurality of micropatterns spaced apart from the first diffraction grating pattern by a predetermined interval is formed. The plurality of micropatterns are arrayed in a direction perpendicular to an array direction of the second diffraction grating pattern at a predetermined pitch. At least the first and second diffraction grating patterns formed on the mask are projected on a photosensitive substrate through a lens. Distortion including a positional shift component of an image point by aberration of the lens is measured by scanning the photosensitive substrate using coherent light having a diffractable wavelength and by measuring an interval between at least the first and second diffraction grating patterns. A distortion measuring apparatus and reticle are also disclosed.

11 Claims, 3 Drawing Sheets

METHOD AND APPARATUS FOR MEASURING POSITIONAL SHIFT/ DISTORTION BY ABERRATION

BACKGROUND OF THE INVENTION

The present invention relates to a method of measuring distortion by aberration of a lens and, more particularly, to a method and apparatus for measuring a positional shift and distortion of an image point by aberration of a lens of a projection optical system used for reduction projection exposure.

In the exposure (lithography) process for manufacturing a semiconductor element, liquid crystal display element, or thin-film magnetic head, a reduction projection exposure apparatus is used, which, using a reticle having a predetermined magnification as a mask (photomask), projects a pattern reduced to the original size through a projection optical system and exposes it. In this reduction projection exposure apparatus, to accurately form the pattern image of the reticle on the resist of the substrate and expose it, aberrations in the projection optical system must be made as small as possible.

Of aberrations of the projection optical system, an aspherical aberration such as coma (also called "comatic aberration") due to the magnification difference between various annular zones of a lens is inspected using a reticle having an inspection pattern, e.g., a line-and-space pattern having a pitch about twice the exposure wavelength. More specifically, the inspection pattern is exposed on a substrate coated with a resist. The asymmetry of the resist image of the inspection pattern formed by a substrate development process is measured using an SEM (Scanning Electron Microscope). On the basis of the measurement result, the coma of the projection optical system is measured. Note that Japanese Patent Laid-Open Nos. 6-117831 and 8-78309 are referred to for aberration measurement and distortion measurement.

As described above, in the conventional method of quantitatively measuring the coma of a projection optical system, an inspection pattern is exposed using a reticle having several line-and-space charts arrayed at a pitch about twice the exposure wavelength, the line width is measured using a length-measuring SEM, and the coma amount is calculated on the basis of the line width difference between the two ends of the pattern. In this conventional method, however, although the coma amount can be estimated, the positional shift of an image point due to the coma cannot be measured.

As for distortion of an image by a lens as well, the distortion amount can be measured. However, the designed pitch of the distortion check mark is different from that of an actual device. For this reason, in a lens of a projection optical system having coma, the positional shift as a measurement value is different from that in device exposure.

In measuring distortion including a positional shift due to the coma of the projection optical system lens of a reduction projection exposure apparatus, the positional shift due to the line width difference of the inspection pattern cannot be measured. Hence, as one of important objects, automatic, high-speed, and easy distortion measurement need be realized.

SUMMARY OF THE INVENTION

It is an object of the present invention to provide a method and apparatus for measuring a positional shift/distortion by aberration, which allow automatic measurement of positional shift components of an image point in lens aberration, including both distortion and a positional shift of the image point due to coma.

In order to achieve the above object, according to the present invention, there is provided a distortion measuring method comprising the steps of forming a mask having at least a first diffraction grating pattern having an array of a plurality of large patterns and a second diffraction grating pattern having arrays of a plurality of micropatterns spaced apart from the first diffraction grating pattern by a predetermined interval, the plurality of micropatterns being arrayed in a direction perpendicular to an array direction of the second diffraction grating pattern at a predetermined pitch, projecting at least the first and second diffraction grating patterns formed on the mask on a photosensitive substrate through a lens, and scanning the photosensitive substrate using coherent light having a diffractable wavelength and measuring an interval between at least the first and second diffraction grating patterns, thereby measuring distortion including a positional shift component of an image point by aberration of the lens.

DESCRIPTION OF THE PREFERRED EMBODIMENTS

The present invention will be described below in detail with reference to the accompanying drawings.

Figures 1A, 1B:
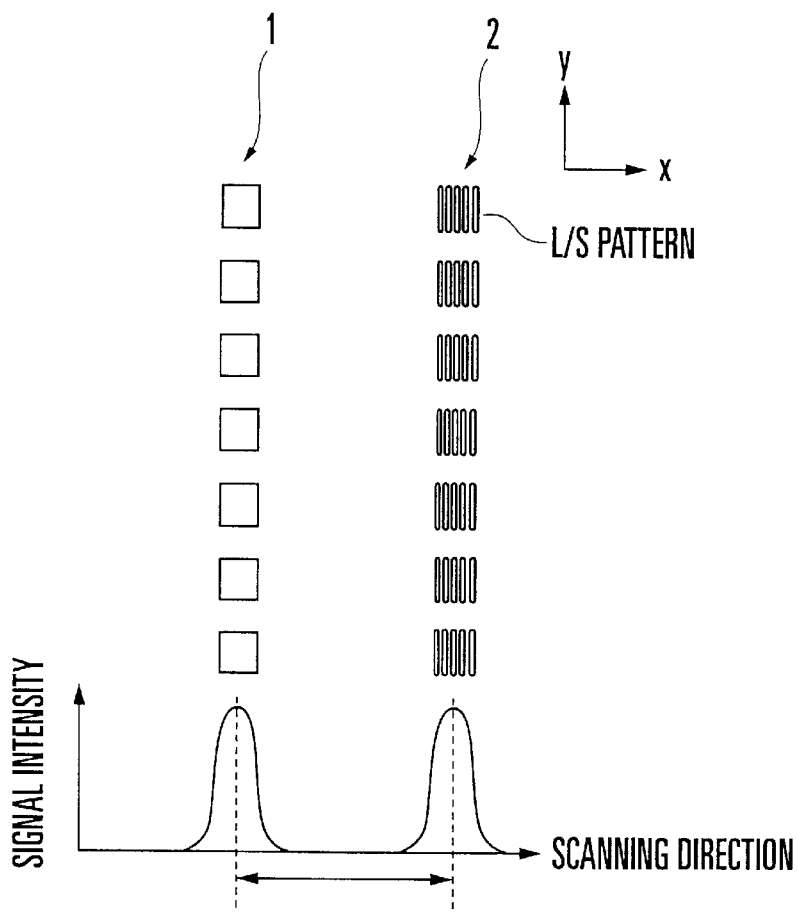
FIG. 1A is a view showing a distortion measuring pattern including a positional shift by coma so as to explain a measuring method according to an embodiment of the present invention.
FIG. 1B is a graph showing the relationship between a scanning position and a signal intensity when the distortion measuring pattern shown in FIG. 1A is scanned.

FIG. 1A explains a measuring method according to an embodiment of the present invention. FIG. 1A shows a distortion measuring pattern (also called a "mark") including a positional shift by coma. This measuring pattern is drawn on an inspection reticle. A substrate coated with a resist is exposed and developed using the drawn inspection reticle. More specifically, FIG. 1A also shows the shape of the inspection pattern formed on the resist of the substrate exposed and developed using the inspection reticle.

Referring to FIG. 1A, this inspection pattern is made up of a diffraction grating having large patterns serving as a main scale 1, and a diffraction grating having blocks of line-and-space (L/S) patterns (micropatterns) serving as a vernier 2. The main scale 1 and vernier 2 are arrayed in parallel to each other and spaced apart at a predetermined interval. The line-and-space patterns of the vernier 2 are arrayed in the formation direction (y direction) of the diffraction grating and in a direction (x direction) perpendicular to the formation direction at pitches corresponding to the pitches of a device pattern to be actually manufactured. In the example shown in FIG. 1A, the line-and-space patterns of the vernier 2 are formed at several pitches in correspondence with the interconnection pitches of an actual device.

One pattern of the main scale 1 has a square shape. However, the shape is not limited to this as far as the pattern is a large pattern functioning as a diffraction grating.

The interval between the main scale 1 and the vernier 2 is sufficiently long with respect to the wavelength of coherent light used for measurement, though the distance generates no Abbe error by the coordinate measurement system.

On the substrate having the two linear diffraction gratings formed by patterning, the interval between the two diffraction gratings is scanned using coherent light that has a sufficiently diffractable wavelength and coherency, and the interval between the two diffraction gratings is measured. FIG. 1B shows the relationship between the signal intensity of light and the coherent light scanning position when the two diffraction grating patterns are scanned by coherent light.

Errors may be reduced by an averaging effect by measuring a pattern a plurality of number of times or using a plurality of patterns. When the diffraction grating patterns are formed not only in the y direction but also in the x direction or radial directions between the x and y directions, more detailed distortion data can be obtained.

With this measurement, the positional shift amount for actual device exposure is measured.

Figure 2:
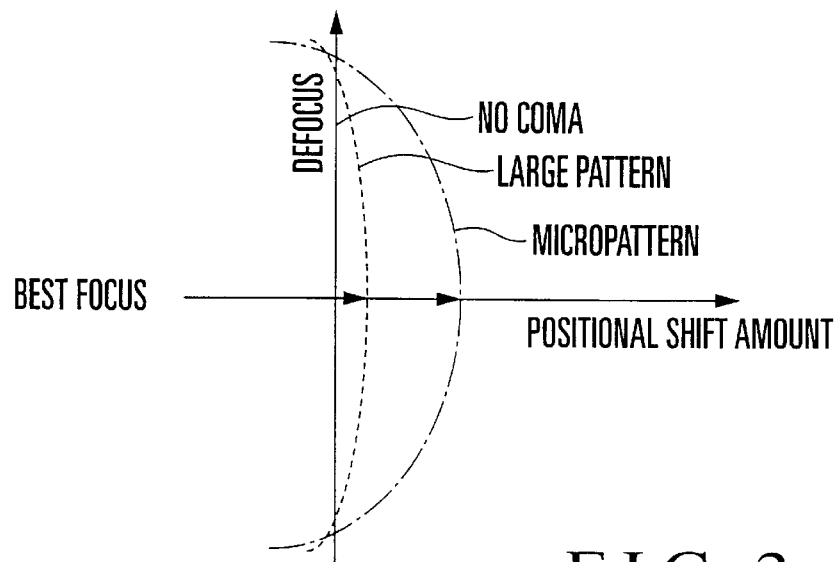
FIG. 2 is a graph for explaining the focusing dependence of a positional shift by coma.

FIG. 2 shows the relationship between the positional shift and the focusing axis (ordinate) when a lens has coma. The abscissa represents the positional shift amount. In coma, the contrast degrades like a cometary pattern, and the position of an image point also shifts. The positional shift component by coma changes depending on the pitch of the line-and-space pattern. As shown in FIG. 2, the positional shift is small for a large pattern. A micropattern is sensitive to aberration, and the position al shift becomes large. For pure distortion, the positional shift amount does not change depending on the pitch of a pattern.

In this embodiment, as shown in FIG. 1A, a large pattern with a small positional shift is used as the main scale 1, and a micropattern with a large positional shift is used as the vernier 2. In this case, the actual positional shift including both the positional shift by distortion and that by coma of the lens can be measured.

To separate the positional shift by coma from that by distortion, a vernier 3 formed from a large pattern is added. The verniers 2 and 3 are arrayed on both sides of the main scale 1 while being spaced apart from the main scale 1 by predetermined intervals. When the distances between the main scale 1 and the verniers 2 and 3 are measured, the aberrations can be separated. This is because the vernier 2 is formed from a micropattern such that it becomes sensitive to aberration.

Figure 3A:
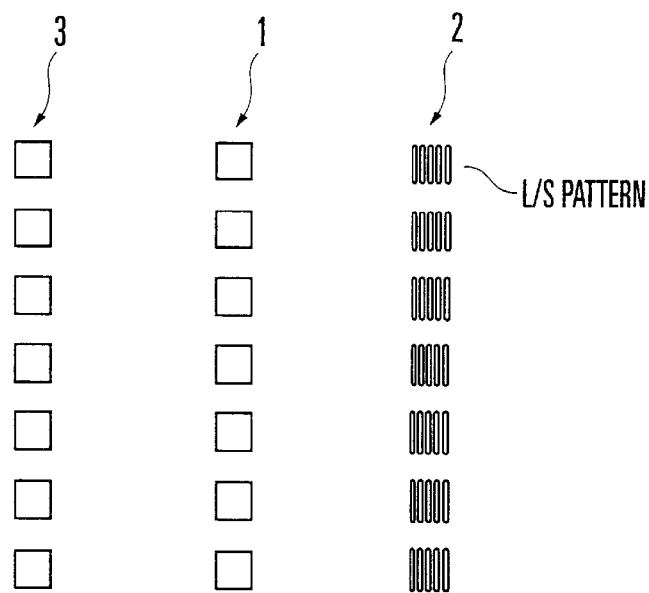
FIG. 3A is a view showing a measuring pattern for separating a positional shift by coma from a positional shift due to distortion so as to explain a measuring method according to another embodiment of the present invention.
Figure 3B:
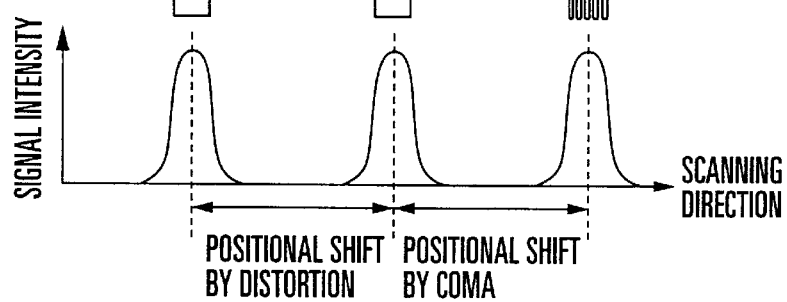
FIG. 3B is a graph showing the relationship between a scanning position and a signal intensity when the measuring pattern shown in FIG. 3A is scanned.

Referring to FIG. 3B, in the relationship between the scanning direction and the intensity of the light-receiving signal of measurement light, the distance between a peak corresponding to the main scale 1 and a peak corresponding to the vernier 3 corresponds to the positional shift by distortion. The distance between the peak corresponding to the main scale 1 and a peak corresponding to the vernier 2 corresponds to the positional shift by coma.

Figure 5:
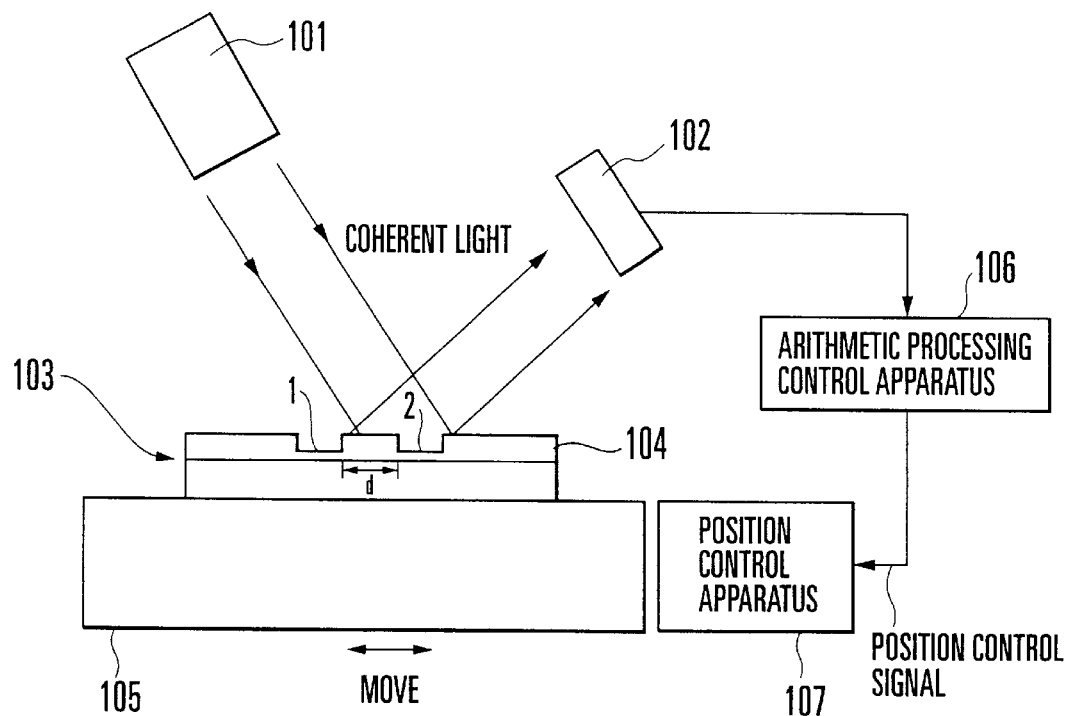
FIG. 5 is a view showing the arrangement of a measuring apparatus according to the present invention.

FIG. 5 shows the arrangement of a distortion measuring apparatus according to the present invention.

The distortion measuring apparatus shown in FIG. 5 comprises a stage 105 on which a photosensitive substrate 103 such as a wafer is placed. The photosensitive substrate 103 has a pattern (mark structure) of first and second diffraction gratings which are formed from the main scale 1 and vernier 2 on a resist (photosensitive film) 104 by a reduction projection exposure apparatus using the above-described reticle. The apparatus also has a laser source 101 for projecting coherent light onto the photosensitive substrate 103 as exit light, a light-receiving section 102 for receiving diffracted light from the photosensitive substrate 103 and converting the light into an electrical signal, an arithmetic processing control apparatus 106 constructed by a CPU (Central Processing Unit) for receiving the electrical signal from the light-receiving section 102 and measuring the interval between the two diffraction gratings on the basis of the signal intensity, and a position control apparatus 107 for controlling X- and Y-direction movement of the stage 105.

To scan the photosensitive substrate 103 with coherent light, the arithmetic processing control apparatus 106 outputs a control signal for moving the stage 105 to the position control apparatus 107. The photosensitive substrate 103 having the two diffraction gratings formed by patterning is scanned in a direction perpendicular to the formation direction of the two diffraction gratings using coherent light having a sufficiently diffractable wavelength and coherency, and an interval d between the two diffraction gratings is measured.

With this operation, a positional shift including a positional shift by coma of the lens and that by distortion is measured. As shown in FIG. 3A, when the vernier 3 is formed on the resist 104, the positional shift by coma of the lens can be measured separately from that by distortion.

In the above-described example, the present invention is applied to measurement of a positional shift by coma. The present invention can also be applied to telecentric measurement of an optical axis. The telecentricity of an optical axis means that one of the entrance pupil and exit pupil has infinity. When an aperture stop is placed at the rear focal point of an image space or at the front focal point of an object space, the principal ray becomes parallel to the optical axis in the object space or image space.

The dependence of the positional shift on focusing when coma is present is shown in FIG. 2. If telecentricity is not maintained, a linear dependence on focusing is exhibited. The dependence of the positional shift on focusing can be measured by exposing the main scales 1 under a predetermined focus condition and exposing some verniers 2 under a defocusing condition.

Figure 4:
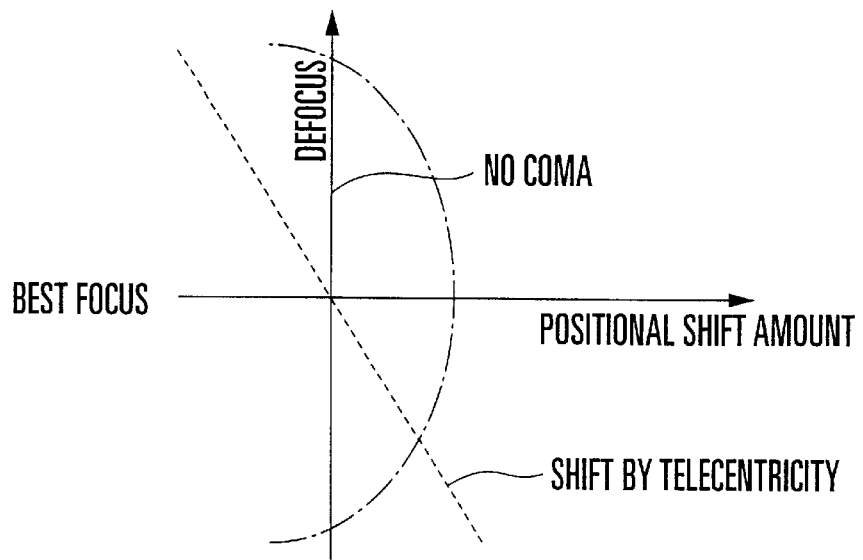
FIG. 4 is a graph for explaining a positional shift due to positional shifts by coma and by a shift in telecentricity.

The gradient (broken line in FIG. 4) obtained by approximating the dependence on focusing by a straight line represents the positional shift component by telecentricity.

When the positional shift by telecentricity is separated from that by coma, the coefficient of the highest degree in approximation using a linear even function (a quartic coefficient in approximation using a quartic function) corresponds to the coma component.

As has been described above, according to the present invention, the positional shift components of an image point in lens aberration can be automatically measured, including not only a positional shift by distortion but also a positional shift of the image point by coma.

The reason for this is as follows. In the present invention, a main scale as a large pattern and a vernier as a micropattern are formed on an inspection reticle. This makes it possible to measure the sum of the positional shift by coma and that by distortion as a value close to that in exposure of an actual device.

What is claimed is:

1. A distortion measuring method comprising the steps of:
   forming a mask having at least a first diffraction grating pattern having an array of a plurality of large patterns and a second diffraction grating pattern having arrays of a plurality of micropatterns spaced apart from the first diffraction grating pattern by a predetermined interval, the plurality of micropatterns being arrayed in a direction perpendicular to an array direction of the second diffraction grating pattern at a predetermined pitch;
   projecting at least the first and second diffraction grating patterns formed on the mask on a photosensitive substrate through a lens; and
   measuring a positional shift component of an image point by distortion and a positional shift component of the image point by aberration of the lens by scanning the photosensitive substrate using coherent light having a diffractable wavelength and by measuring an interval between at least the first and second diffraction grating patterns.

2. A method according to claim 1, wherein the first diffraction grating pattern forms a main scale, and the second diffraction grating pattern forms a vernier arrayed in parallel to the main scale.

3. A method according to claim 1, wherein
   the forming step further comprises the step of forming, on the mask, a third diffraction grating pattern having an array of a plurality of large patterns in parallel to and spaced apart from the first diffraction grating pattern by a predetermined interval,
   the projecting step comprises the step of projecting the first, second, and third diffraction grating patterns formed on the mask on the photosensitive substrate through the lens, and
   the measuring step comprise the step of scanning the photosensitive substrate using the coherent light having the diffractable wavelength and measuring intervals between the first diffraction grating pattern and the second and third diffraction grating patterns, thereby measuring said positional shift component of said image point by distortion and said positional shift component of the image point by aberration of the lens.

4. A method according to claim 1, wherein the forming step comprises the step of forming a plurality of sets of the first and second diffraction grating patterns on the mask.

5. A method according to claim 1, wherein
   the forming step comprises the step of forming a pattern including at least one pair of the first and second diffraction grating patterns on a reticle to be used for aberration adjustment of the lens of a projection optical system,
   the projecting step comprises the step of, using the reticle having the first and second diffraction grating patterns, exposing and developing the pattern on the photosensitive substrate, and
   the measuring step comprises the step of scanning the photosensitive substrate in a direction perpendicular to array directions of the first and second diffraction grating patterns formed on the photosensitive substrate using the coherent light having the diffractable wavelength and measuring the interval between the first and second diffraction grating patterns, thereby measuring said positional shift component of said image point by distortion and said positional shift component of the image point by aberration of the lens of the projection optical system.

6. A method according to claim 5, wherein
   the exposing and developing step comprises the step of exposing the first diffraction grating pattern under a predetermined focusing condition and exposing some second diffraction grating patterns under a defocusing condition, and
   a focusing dependence of the positional shift of the image point by telecentricity of the lens of the projection optical system is measured by measuring the interval between the first and second diffraction grating patterns.

7. A distortion measuring apparatus comprising:
   placing means for placing a photosensitive substrate on which a first diffraction grating pattern having an array of a plurality of large patterns and a second diffraction grating pattern having arrays of a plurality of micropatterns spaced apart from the first diffraction grating pattern by a predetermined interval are transferred through a lens, the first and second diffraction grating patterns being formed on a mask, and the plurality of micropatterns being arrayed in a direction perpendicular to an array direction of the second diffraction grating pattern at a predetermined pitch;
   light projection means for projecting coherent light having a diffractable wavelength to the interval between the first and second diffraction grating patterns transferred onto the photosensitive substrate;
   light-receiving means for receiving reflected light from the first and second diffraction grating patterns transferred onto the photosensitive substrate; and
   scanning control means for scanning the coherent light from said light projection means relatively in a direction perpendicular to array directions of the first and second diffraction grating patterns on the photosensitive substrate and measuring an interval between the first and second diffraction grating patterns, thereby measuring a positional shift component of an image point by distortion and a positional shift component of an image point by aberration of the lens.

8. An apparatus according to claim 7, wherein the first diffraction grating pattern forms a main scale, and the second diffraction grating pattern forms a vernier arrayed in parallel to the main scale.

9. An apparatus according to claim 7, wherein
   the mask further has a third diffraction grating pattern having an array of a plurality of large patterns in parallel to and spaced apart from the first diffraction grating pattern by a predetermined interval, and
   said scanning control means scans the photosensitive substrate on which the first, second, and third diffraction grating patterns are transferred, using the coherent light having the diffractable wavelength and measures intervals between the first diffraction grating pattern and the second and third diffraction grating patterns, thereby measuring said positional shift component of said image point by distortion and said positional shift component of the image point by aberration of the lens.

10. An apparatus according to claim 7, wherein the mask has a plurality of sets of the first and second diffraction grating patterns on the mask.

11. An apparatus according to claim 7, wherein
a pattern including at least one pair of the first and second diffraction grating patterns are formed on a reticle to be used for aberration adjustment of the lens of a projection optical system,
using the reticle having the first and second diffraction grating patterns, the pattern is exposed and developed on the photosensitive substrate, and
said scanning control means scans the photosensitive substrate in a direction perpendicular to array directions of the first and second diffraction grating patterns formed on the photosensitive substrate using the coherent light having the diffractable wavelength and measures the interval between the first and second diffraction grating patterns, thereby measuring said positional shift component of said image point by distortion and said positional shift component of the image point by aberration of the lens of the projection optical system.

* * * * *